United States Patent [19]

Yoshida et al.

[11] 3,969,927
[45] July 20, 1976

[54] VIBRATION MEASURING AND THE APPARATUS THEREFOR

[75] Inventors: Masafumi Yoshida; Naohiro Murayama; Hiroshi Obara, all of Iwaki, Japan

[73] Assignee: Kureha Kagaku Kogyo Kabushiki Kaisha, Tokyo, Japan

[22] Filed: Aug. 8, 1974

[21] Appl. No.: 495,740

[30] Foreign Application Priority Data
Aug. 8, 1973   Japan.................................. 48-88959

[52] U.S. Cl............................... 73/71.4; 73/DIG. 4
[51] Int. Cl.² ........................................... G01H 1/00
[58] Field of Search......... 73/71.4, 71.5 R, 71.5 US, 73/DIG. 4, 88.5 R; 310/8.1, 8.7; 340/261; 179/110 A

[56] References Cited
UNITED STATES PATENTS

| | | | |
|---|---|---|---|
| 3,239,696 | 3/1966 | Burkhalter et al.................... | 310/8.6 |
| 3,365,593 | 1/1968 | Roof et al............................ | 310/8.7 |
| 3,720,285 | 3/1973 | Russell et al........................ | 181/151 |
| 3,750,127 | 7/1973 | Ayers et al.......................... | 340/261 |
| 3,792,204 | 2/1974 | Murayama et al............... | 179/110 A |
| 3,832,580 | 8/1974 | Yamamuro et al.......... | 179/110 A X |
| 3,903,733 | 9/1975 | Murayama et al.................... | 73/71.4 |

Primary Examiner—Richard C. Queisser
Assistant Examiner—John P. Beauchamp
Attorney, Agent, or Firm—Sughrue, Rothwell, Mion, Zinn & Macpeak

[57] ABSTRACT

A method of measuring the mechanical vibration of an object comprising contacting one of the surfaces of a piezoelectric element comprising a polarization treated polyvinylidene fluoride piezoelectric film having metal thin films as electrodes deposited on both surfaces thereof with an object to be measured while covering the opposite surface of the piezoelectric element contacting with the object to be measured with a flexible sound absorbing material for avoiding interference with sound waves in the surroundings and measuring or detecting the vibration of the object by the changes in the electric field caused by the vibration of the object and produced on the surface of the piezoelectric element.

3 Claims, 2 Drawing Figures

FIG.1
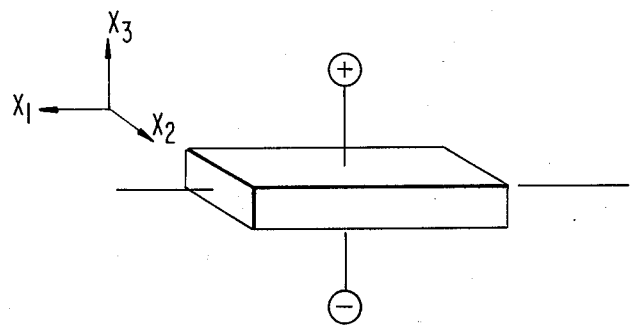
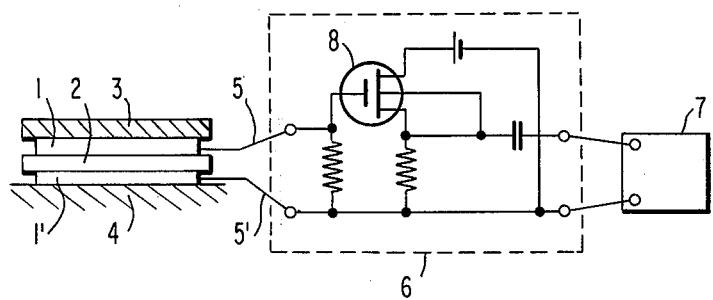
FIG.2

VIBRATION MEASURING AND THE APPARATUS THEREFOR

BACKGROUND OF THE INVENTION

1. Field of the Invention

This invention relates to a method of measuring the vibration of a solid object by means of a vibration measuring apparatus utilizing a high molecular weight piezoelectric film as a vibration detecting element in which the noise likely to be caused by sound waves can be prevented. This invention also relates to a measuring device for use with such a method.

2. Description of the Prior Art

It is known that certain materials such as high molecular weight substances, for example, proteins, poly-γ-methylglutamate and the like exhibit piezoelectricity. It is also known that the shaped articles of polyvinyl chloride, polymethylmethacrylate, or other similar high molecular weight polar substances can be subjected to a so-called polarization treatment in which they are subjected to heat treatment under a high voltage static electrical field to produce shaped articles of high molecular weight substances having piezoelectric properties. Particularly, when polyvinylidene fluoride is used as a high molecular weight polar substance and the molecules therein are arranged in such a crystal structure that can easily produce the highest polarization, piezoelectric constants comparable with those of Rochelle salt are obtained. Typical crystal structures of polyvinylidene fluoride include an α-type structure and a β-type structure, the latter having a zigzag planer crystal structure and hence being likely to form a polar structure. Usually, polyvinylidene fluoride, when melted and extruded, often assumes the α-type crystal structure but the crystal structure of the extruded product is wholly or partially changed into the β-type crystal structure when the extruded product is stretched at a relatively low temperature (for example, below 130°C for the homopolymer).

Taking axes $X_1$ and $X_2$ along the plane of a film and axis $X_3$ in the direction of the thickness of the film, as shown in FIG. 1 of the drawing, and applying a stress along the direction of the axis $X_1$ in the film, the polarization produced along the direction of the axis $X_3$ is represented as $d_{31}$. When a tensile stress is applied in the same axis direction as the direction in which the polyvinylidene fluoride is stretched the piezoelectric constant $d_{31}$ produced sometimes reaches as high as $1 \times 10^{-6}$ c.g.s.e.s.u. at the maximum. In addition, the stress applied to non-oriented or biaxially oriented films along any two directions produces a piezoelectric body having a $d_{31}$ as high as $5 \times 10^{-8}$ c.g.s.e.s.u.

Natural high molecular weight substances such as proteins or many polarized film products of high molecular polar substances other than polyvinylidene fluoride such as e.g., polyvinyl fluoride, polyvinylidene chloride, polyvinyl chloride, polymethylmethacrylate or the like have a maximum $d_{31}$ of about $10^{-8}$ to $10^{-11}$ c.g.s.e.s.u and these substances with piezoelectric constants of such order can also be used as piezoelectric elements by combining them with amplifiers suitable for the purpose.

For the high molecular weight substances having piezoelectric properties as stated above, various applications as electric-mechanical or mechanical-electric transducer elements can be contemplated just as for Rochelle salt and ceramic piezoelectric materials. Particularly, when they are used as measuring devices for mechanical vibration, films of any desired size can be obtained due to the nature of the high molecular weight compound and, generally, they provide many advantages such as a high impact strength as compared with inorganic piezoelectric materials, a lower Young's modulus which scarcely interferes with the mechanical vibration when they are used as thin films contacting the object to be measured over a broad area, no selectivity for a particular wave length since they do not have a substantial resonance point, etc.

When such high molecular weight piezoelectric films are used as measuring devices for mechanical vibration, suitable metal thin films such as of gold, platinum, silver, copper, nickel, iron chromium, aluminum, tin, zinc, or the like are usually deposited on both surfaces of the high molecular weight films as electrodes by way of plating, sputtering, etc. and the piezoelectric element contacted with the surface of an object to be measured by suitable means such as screwing, flange connection, etc. Mechanical vibration is measured by converting the vibration to change in the electric field intensity on the film surface which are caused by the shrinking and stretching of the high molecular weight piezoelectric films.

It has, however, been found that noises are sometimes generated by environmental sound waves to produce errors in the results obtained measuring the mechanical vibration of a solid material by using a high molecular weight piezoelectric film devices. It is believed that the noises are generated when the high molecular weight film picks up sound waves in the surroundings because of its high sensitivity also to sound waves.

SUMMARY OF THE INVENTION

It is an object of this invention to provide a method and apparatus for measuring the mechanical vibration of solid materials capable of avoiding the interference of sound waves by covering the electrode on the opposite surface of the high molecular weight piezoelectric element that is contacted to the object to be measured with flexible sound absorbing material.

BRIEF DESCRIPTION OF THE ACCOMPANYING DRAWINGS

FIG. 1 is a view for illustrating the concept of the piezoelectric constant.

FIG. 2 is a view for illustrating the principle of the method of measuring mechanical vibration and the apparatus therefore according to this invention.

DESCRIPTION OF A PREFERRED EMBODIMENT OF THE INVENTION

This invention will now be described in detail by way of a preferred embodiment thereof described in the accompanying drawings, in particular, in FIG. 2, wherein metal thin film electrodes 1 and 1' are deposited on both surfaces of a high molecular weight piezoelectric film 2. The surface of one electrode 1 is covered with flexible sound absorbing material 3 and the surface of the other electrode 1' not covered with such a sound absorbing material is to be contacted to the object to be measured. Leads 5 and 5' from the electrodes 1 and 1' are connected through an impedance conversion circuit 6 to a measuring device or detecting device 7 where the changes in the electric field on the piezoelectric film caused by the vibration of the object are measured or detected. Reference numeral 8 denotes a field effect transistor, which can be replaced with another appropriate impedance conversion device such as a vacuum tube or the like. As the measuring device or the detecting device, various means can be employed including a voltmeter, ammeter, recorder, oscillograph, a combination of any of them with a computer, or an alarm, etc.

Flexible sound absorbing materials are preferably chosen from those groups of materials having high sound absorbing effect such as high molecular weight elastic material or foams, for example, rubber, polyurethane, rubber foams, polyethyrene foams, ethyrenevinylacetate foams, etc. Where very high measuring accuracy is not required, plastics having lower sound absorbing effects can also be used such as a film of soft polyethylene, soft polyvinylchloride, etc. but also the molded articles of these plastic films of relatively lower absorbing effects must have a lower Young's modulus than that of the high molecular weight piezoelectric film. It should be noted that the flexible sound absorbing material need not necessarily be adhered integrally with one electrode of the high molecular weight piezoelectric film provided that the material contacts and covers the surface of the piezoelectric element at the time of vibration measurement so as to prevent sound in the surroundings from directly passing to the high molecular weight piezoelectric film.

Although it is not preferred to cover the surface of the high molecular weight piezoelectric film contacting the object to be detected with sound absorbing materials, the piezoelectric film can be covered, for the purpose of insulation or protection of the electrode, with a thin (0.1 – 10 $\mu$) high molecular weight film which scarcely absorbs the mechanical vibration and hence does not cause any difficulty in measurement. According to the process of this invention, all types of mechanical vibrations passing through solid objects can be measured such as the beating of the heart and convulsions in living bodies, etc. as well as the vibration of machinery.

While the invention has been particularly shown and described with reference to a preferred embodiment thereof, it will be understood by those skilled in the art that various changes in form and details may be made therein without departing from the spirit and scope of the invention.

What is claimed is:

1. A method of measuring or detecting vibration comprising uniformily contacting one of the surfaces of a piezoelectric element comprising a polarization treated polyvinylidene fluoride piezoelectric film having a metal thin film as electrodes deposited on both surfaces thereof with an object to be measured while covering the opposite surface of said piezoelectric element contacted with the object to be measured with a soft polymer film having a lower Young's modulus than said polyvinylidene fluoride piezoelectric film, and measuring or detecting the vibration of the object by the changes in the electric field caused by the vibration of the object on the surface of said piezoelectric element.

2. An apparatus for measuring or detecting vibration comprising a piezoelectric element comprising a polarization treated polyvinylidene fluoride piezoelectric film having a metal thin film deposited on both surfaces thereof and a soft polymer film having a lower Young's modulus than said polyvinylidene fluoride piezoelectric film covering one electrode on one surface of said piezoelectric film, the opposite surface of covering with said soft polymer film being utilized as a contacting surface for measuring vibration.

3. An apparatus for measuring or detecting vibration comprising a piezoelectric element comprising a polarization treated polyvinylidene fluoride piezoelectric film having a metal film deposited on both surfaces thereof and a flexible sound absorbing material covering one electrode on one surface of said piezoelectric film, the opposite surface of covering with said sound absorbing material being covered with a thin high molecular weight film which scarcely absorbs mechanical vibration, said opposite surface being utilized as a contacting surface for measuring vibration.

* * * * *